United States Patent [19]

Gupta et al.

[11] Patent Number: 5,696,470
[45] Date of Patent: Dec. 9, 1997

[54] SOLID-STATE ELECTRONIC SWITCHING MODULE

[75] Inventors: Ramesh Kumar Gupta, Rockville; Chunming Chen, Germantown; Francois Tavi Assal, Bethesda, all of Md.

[73] Assignee: Comsat Corporation, Bethesda, Md.

[21] Appl. No.: 483,763

[22] Filed: Jun. 7, 1995

[51] Int. Cl.$^6$ ........................................ H01P 1/15
[52] U.S. Cl. .................... 333/103; 333/104; 333/262
[58] Field of Search ............................. 333/101, 103, 333/104; 340/825.9, 825.91, 825.93, 825.94, 825.96

[56] References Cited

U.S. PATENT DOCUMENTS

| | | | |
|---|---|---|---|
| 3,982,212 | 9/1976 | Wallington et al. | 333/104 |
| 4,129,838 | 12/1978 | Wallington et al. | 333/104 |
| 4,151,489 | 4/1979 | Berman et al. | 333/101 X |
| 4,430,732 | 2/1984 | Saga et al. | 370/54 |
| 4,472,691 | 9/1984 | Kumar et al. | 333/103 |
| 4,731,594 | 3/1988 | Kumar | 333/103 |
| 4,858,225 | 8/1989 | deSantis | 370/50 |
| 4,953,155 | 8/1990 | Tangonan et al. | 370/1 |
| 5,055,836 | 10/1991 | Kane | 340/825.85 |
| 5,150,083 | 9/1992 | Chen et al. | 333/103 |
| 5,159,296 | 10/1992 | Nelson | 333/103 |
| 5,375,257 | 12/1994 | Lampen | 333/103 X |

*Primary Examiner*—Paul Gensler
*Attorney, Agent, or Firm*—Sughrue,Mion,Zinn,Macpeak & Seas, PLLC

[57] ABSTRACT

Highly reliable, light-weight, and low power-consuming microwave redundancy and re-routing electronic switches suitable for on-board satellite applications permit rearranging of communication paths for up- and down-link communications and re-routing of microwave signals to redundant devices in the event of on-board hardware failures.

20 Claims, 9 Drawing Sheets

SOLID-STATE ELECTRONIC SWITCHING MODULE

BACKGROUND OF THE INVENTION

1. Field of the Invention

This invention relates to microwave switch configurations that can be used in various on-board satellite applications, such as communication traffic rerouting and redundanccy switch networks. More particularly, the invention relates to solid-state switching modules, including switching elements operating in passive mode, that can be used as building blocks in the formation of switch networks.

2. Brief Discussion of Related Art

In conventional satellite transponders (for example, INTELSAT-VI and VII), waveguide, co-axial, and ferrite switches are used for static and redundancy switch networks. These switches are used occasionally to re-route the communications traffic between up- and down-links, provide signal interconnections between various repeater channels and antenna beams, and to re-route microwave signals to redundant devices in the event of on-board hardware failures.

Most switches used previously in satellite transponders were mechanical in nature. The problem with mechanical switches is that they contribute significantly to the mass of the communications payload. A coaxial switch for INTELSAT-VI applications, for example, typically weighs 135 grams and has dimensions of 2"×1"×1". A (6×6) static switch matrix in INTELSAT-VII has a footprint of 10 cm×18 cm and weighs approximately 2.2 kg.

Since a large number of switches are required in a communication satellite for traffic routing and redundancy switching purposes (e.g., INTELSAT-VI spacecraft has four (8×8) and one (6×6) static switch matrix arrays and INTELSAT-VII spacecraft has five (6×6) and one (4×4) static switch matrix arrays), these switches have significant mass budget impact.

SUMMARY OF THE INVENTION

The principal purpose of the present invention is to prevent the size and weight budget problems associated with conventional static switch matrices.

Accordingly, it is an object of the present invention to provide a small, light-weight, solid-state electronic switching module to reduce the mass budget impact of redundancy and re-routing switches.

It is another object of the present invention to provide a reliable solid-state electronic switching module using passive solid-state switching elements which reduce the amount of power consumed by redundancy and re-routing switches utilizing the switching module.

These and other objects, features and advantages according to the present invention are provided by a solid-state electronic switching module. This switching module includes a plurality of access nodes, passive solid-state switching elements and bias connections permitting application of biasing signals to respective passive solid-state switching elements.

According to one aspect of the invention, during a first connection state, a first conducting path, connecting first and second access nodes, is defined by a plurality of first passive solid-state switching elements, each responsive to a respective bias signal and a second conducting path, connecting third and fourth access nodes, is defined by a plurality of second passive solid-state switching elements, each responsive to a respective bias signal. Additionally, a first isolating path is defined by a plurality of third passive solid-state switching elements, each responsive to a respective bias signal and operatively isolating the first and fourth access nodes while a second isolating path is defined by a plurality of fourth passive solid-state switching elements, each responsive to a respective bias signal and operatively isolating the second and third access nodes.

According to another aspect of the invention, during a second connection state, a third conducting path, connecting the first and the fourth access nodes, is defined by a plurality of fifth passive solid-state switching elements, each responsive to a respective bias signal and a fourth conducting path, connecting the second and third access nodes, is defined by a plurality of sixth passive solid-state switching elements, each responsive to a respective bias signal. Moreover, a third isolating path is defined by a plurality of seventh passive solid-state switching elements, each responsive to a respective bias signal and operatively isolating the first and second access nodes while a fourth isolating path is defined by a plurality of eighth passive solid-state switching elements, each responsive to a respective bias signal and operatively isolating the third and fourth access nodes.

These and other objects, features and advantages according to the present invention are provided by a solid-state "T" switch. This switching module includes first through fourth access nodes, passive solid-state switching elements and bias connections permitting application of biasing signals to respective passive solid-state switching elements so as to permit three connection states.

These and other objects, features and advantages of the invention are disclosed in or will be apparent from the following description of preferred embodiments.

BRIEF DESCRIPTION OF THE DRAWINGS

The preferred embodiments are described with reference to the drawings in which like elements are denoted by like or similar numbers and in which:

FIG. 2(a) is schematic diagram of a double-pole, double throw (DPDT) switch, i.e., a transfer switch, equivalent according to a preferred embodiment of the present invention while

FIG. 5(a) is a schematic diagram of the "T" switch according to another preferred embodiment of the present invention while

DESCRIPTION OF THE PREFERRED EMBODIMENTS

Compared with the mechanical and ferrite switches mentioned above, solid-state electronic switches offer the advantages of having a lower weight and a smaller size while still providing good isolation. Electronic switches have been implemented using PIN diodes or field effect transistors (FETs) as switching elements. It will be appreciated that PIN diode switching elements require bias current in the OFF state, consuming more power than FET switching elements operating in a passive mode. In contrast, FET switching elements can be operated in active mode which offers the advantage of gain in the ON state. However, because of DC power-consumption, reliability is reduced. The FETs used in passive mode (i.e. passive solid-state switching elements) dissipate no power in both ON and OFF states, hence consuming less power and providing better reliability.

Figure 2A:
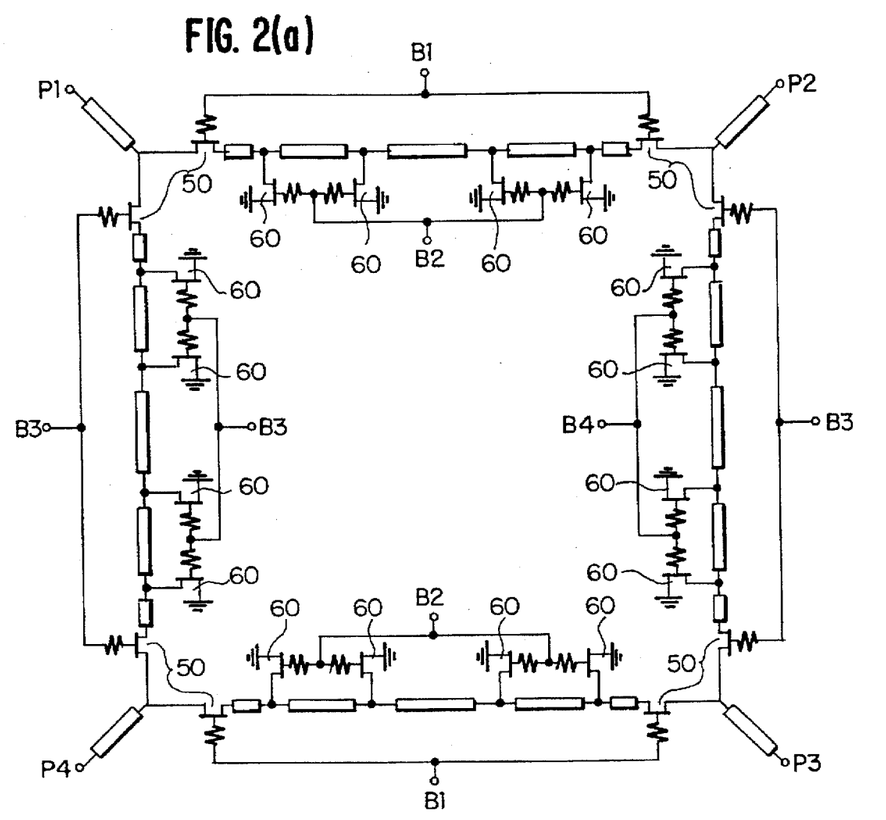

According to at least one preferred embodiment of the present invention, static switch matrices and redundancy switches advantageously are constructed by microwave monolithic integrated circuit (MMIC) switches, which are realized by a combination of series passive FET switching elements 50 and shunt passive; FET switching elements 60 (i.e. isolating solid-state switching elements) as shown in FIG. 2(a). It will be appreciated that there is no bias applied to either the drain or the source of the FETs; only gate bias is used. In the "ON" state, the gate is biased at 0 V, resulting in low resistance between the drain and the source, while in the "OFF" state, the gate is biased beyond pinch off, resulting in high resistance between the drain and the source.

Advantageously, the switch circuits can be fabricated on a GaAs substrate, making them compatible with other MMIC subsystems such as monolithic receivers, microwave switch matrices (MSMs) and driver amplifiers, which devices are employed in various communication satellite repeater applications. Preferably, all of the FET devices and the associated passive matching networks are realized on GaAs substrates, resulting in circuit modules with uniform RF performance, which advantageously are both small in size and low in weight.

Advantageously, the individual circuits offer increased reliability because of fewer manual operations in the assembly. Moreover, the estimated mass of the switches realized by GaAs MMIC technology can be as little as 10% of the size and weight of respective mechanical counterparts. It will be appreciated that these switches are advantageously suited for on-board spacecraft applications in, for example, static switch matrix arrays and redundancy switches at receiver output or TWTA inputs.

Figure 1A:
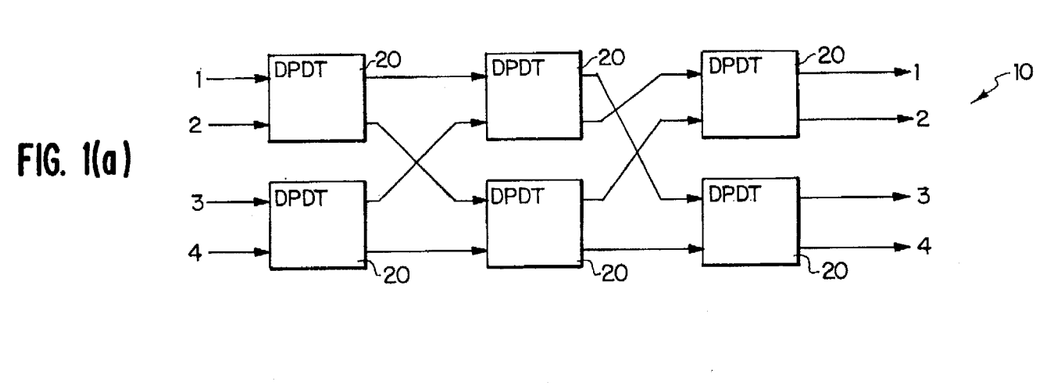
FIGS. 1(a) and 1(b) are block diagrams of 4×4 and 8×8 static switch matrices, respectively, that can be realized by using one embodiment of the present invention as a building block.
Figure 1B:
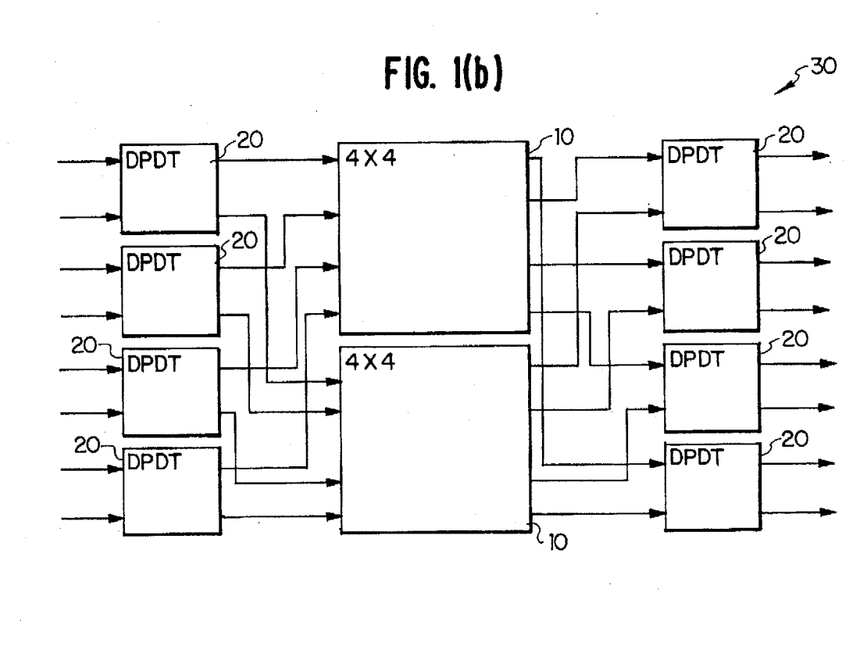

In the construction of a static switch matrix according to a preferred embodiment of the present invention, MMIC DPDT switches are used as the preferred building blocks. In an exemplary case, a (4×4) static switch matrix 10 as shown in FIG. 1(a) can be built up by properly connecting six MMIC DPDT switch modules 20 to provide all of the one-to-one interconnect possibilities between inputs and outputs. Additional (4×4) matrices 10 and DPDT switches 20 can further be used to build an (8×8) switch 30 shown in FIG. 1(b).

Figure 2B:
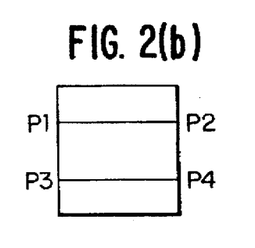
FIGS. 2(b) and 2(c) are two state diagrams representing all of the possible connection states in which the circuitry according to the present invention illustrated in FIG. 2(a) may operate.
Figure 2C:
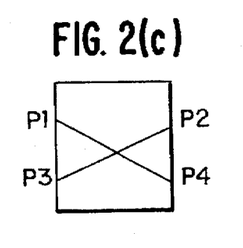

A preferred embodiment of the MMIC DPDT transfer switch 20 is shown schematically in FIG. 2(a). Preferably, the circuit has four RF ports access nodes (P1 to P4) and eight bias connections in four pairs B1 to B4. It will be appreciated that there are two connection states. A first connection state is shown in FIG. 2(b), in which P1 is connected to P2 via a first connecting path including FET switching elements 50 (shown in FIG. 2(a)) and P3 is connected to P4 via a second connecting path including FET switching elements 50 (shown in FIG. 2(a)). In a second connection state, as shown in FIG. 2(c), P1 is connected to P4 via a third connecting path including FET switching elements 50 (shown in FIG. 2(a) and P2 is connected to P3 via a fourth connecting path including FET switching elements 50 (shown in FIG. 2(a)) and P2 connected to P3. The switch is set to the first connection state when 0 V is applied to the bias connection B1 and B4 and a voltage (−Voff) beyond pinch off is applied to bias connections B2 and B3. Switch 20 advantageously can be set to the second connection state when 0 V is applied to bias connections B2 and B3 while −Voff is applied to bias connections B1 and B4.

Figure 3:
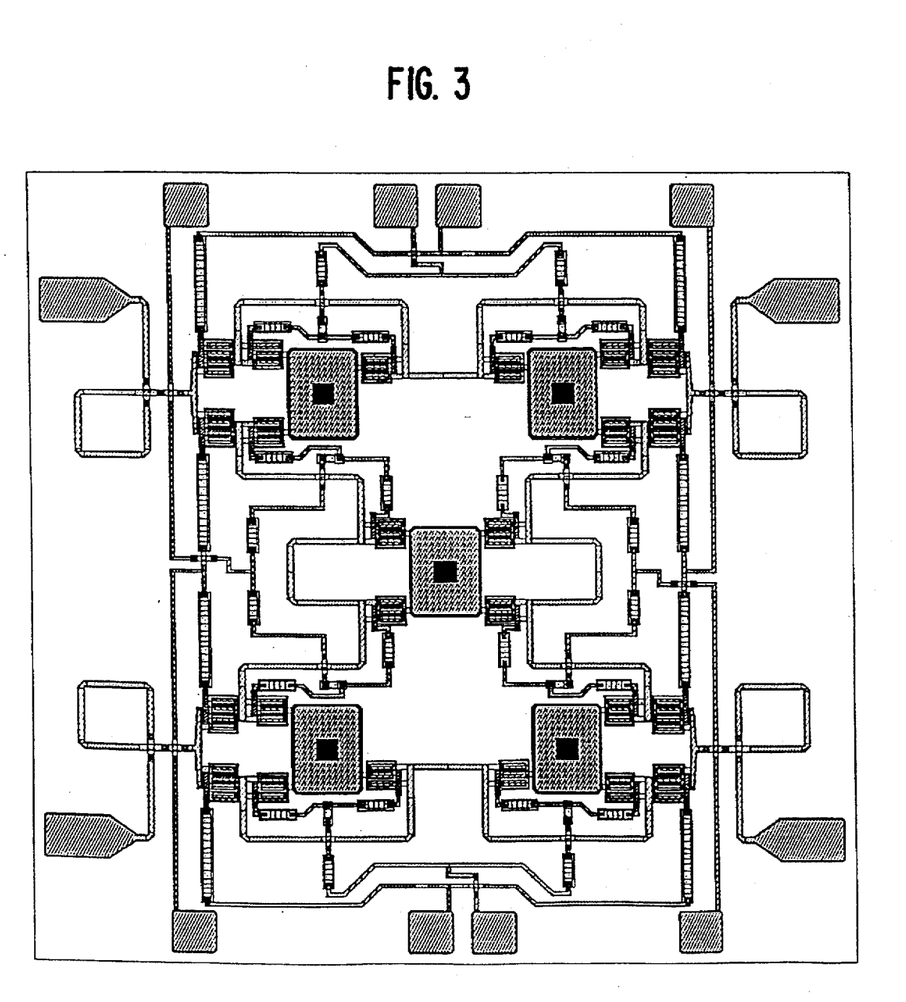
FIG. 3 is an MMIC mask layout for the transfer switch shown in FIG. 2(a)

FIG. 3 shows a MMIC mask layout for the DPDT switch 20 with dimensions of 1.85 mm by 1.85 mm. It will be appreciated that the width of the FETs are optimized to provide minimum insertion loss between the connected ports, maximum isolation between the disconnected ports and optimum input/output impedance match for operation over L-, C-, X-, and Ku microwave bands.

Figure 4:
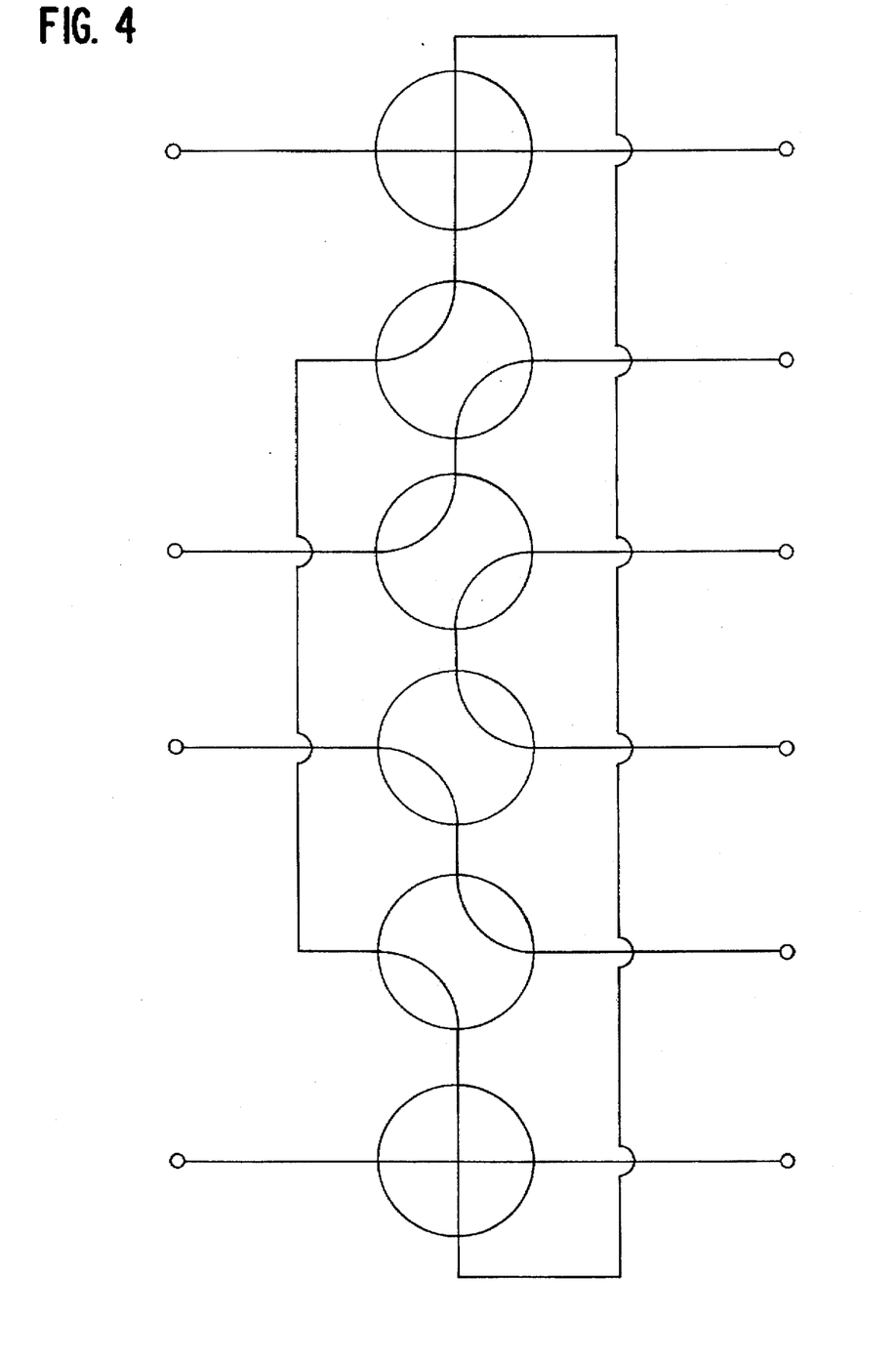
FIG. 4 is a diagram of a 6-for-4 redundancy switch that can be realized by using one embodiment of the present invention, i.e., a so-called "T" switch.
Figure 5A:
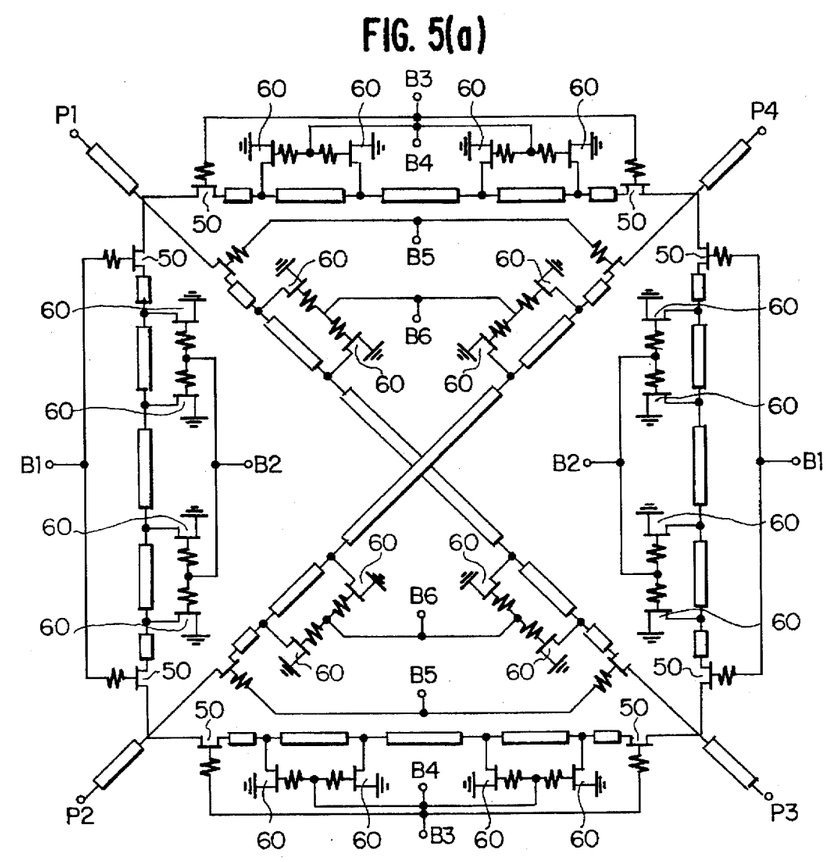
Figure 5B:
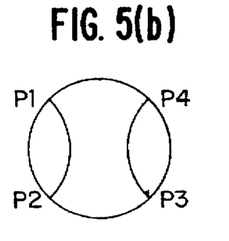
FIGS. 5(b) to 5(d) illustrate three state diagrams representing all possible connection states in which the embodiment of the present invention shown in FIG. 5(a) can operate.
Figure 5C:
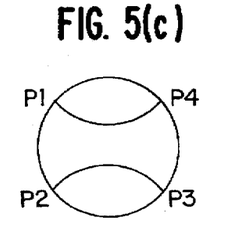
Figure 5D:
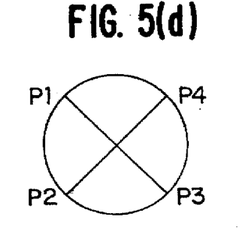

In realizing redundancy switches, a special type of transfer switch with cross-interconnections provides maximum reconfiguration flexibility. An exemplary so-called "T" switch is shown schematically in FIG. 4, wherein a 6-for-4 redundancy switch which can be made by six MMIC switches is shown. The detailed schematics for the MMIC "T" switch equivalent to that illustrated in FIG. 4 is shown in FIG. 5(a). From inspection, it will be appreciated that the circuit has four RF ports, twelve bias connections thirty-six passive solid-state switching elements 50 and 60, and three connection states as illustrated in FIGS. 5(b) to 5(d). Each state advantageously can be set by applying proper bias to the bias connections, i.e., similar to operations as previously described for the DPDT switch 20 alone.

Figure 6:
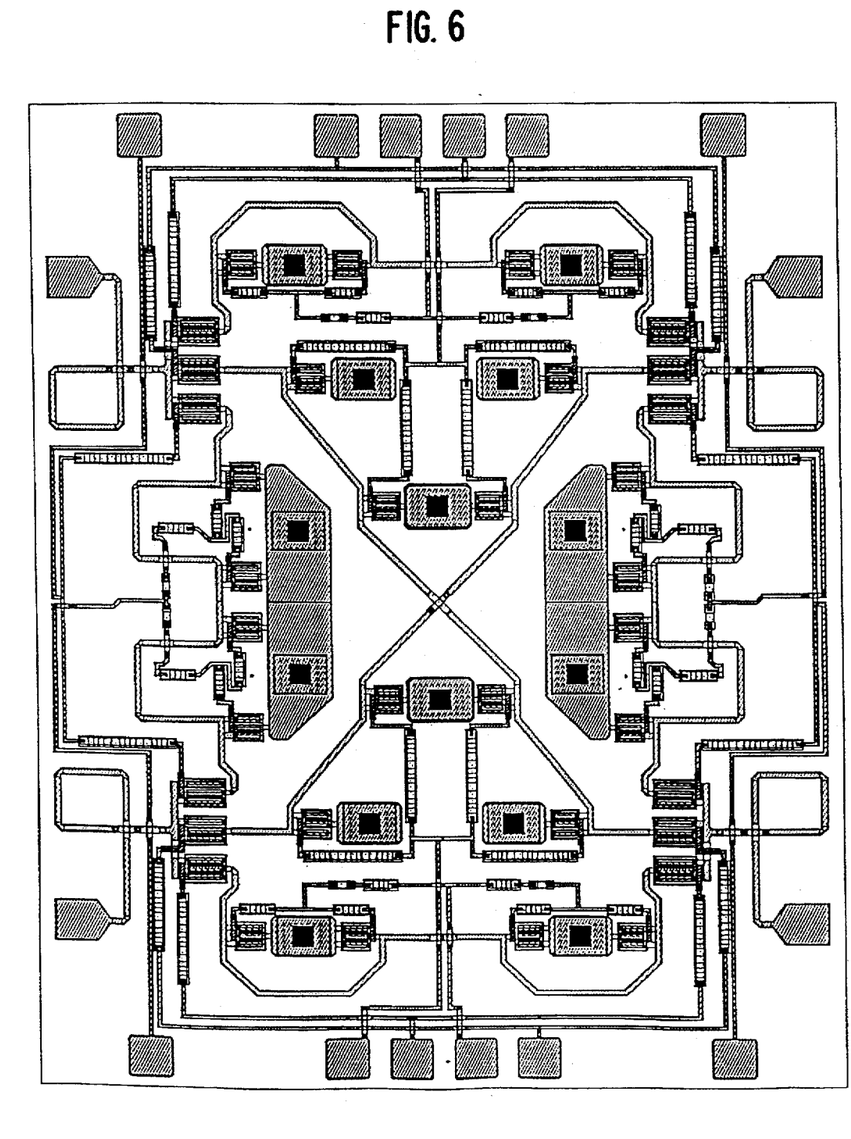
FIG. 6 is a MMIC mask layout for the "T" switch shown in FIG. 5(a)
Figure 7:
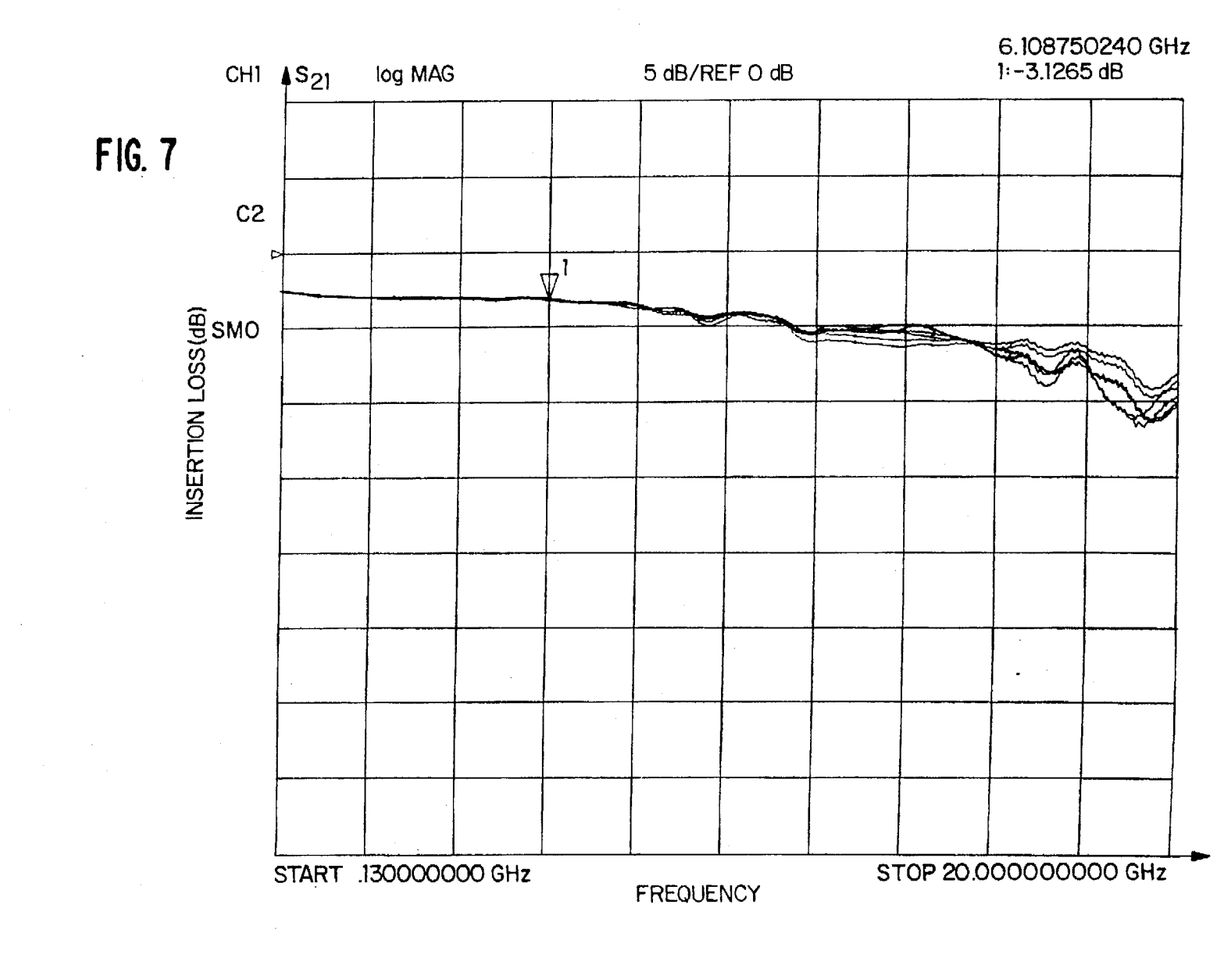
FIGS. 7, 8 and 9 are representations of the curves for the insertion loss, isolation, and return loss, respectively, which correspond to measurements taken during the operation of the transfer switch of FIG. 5(a) in each of its three possible states.
Figure 8:
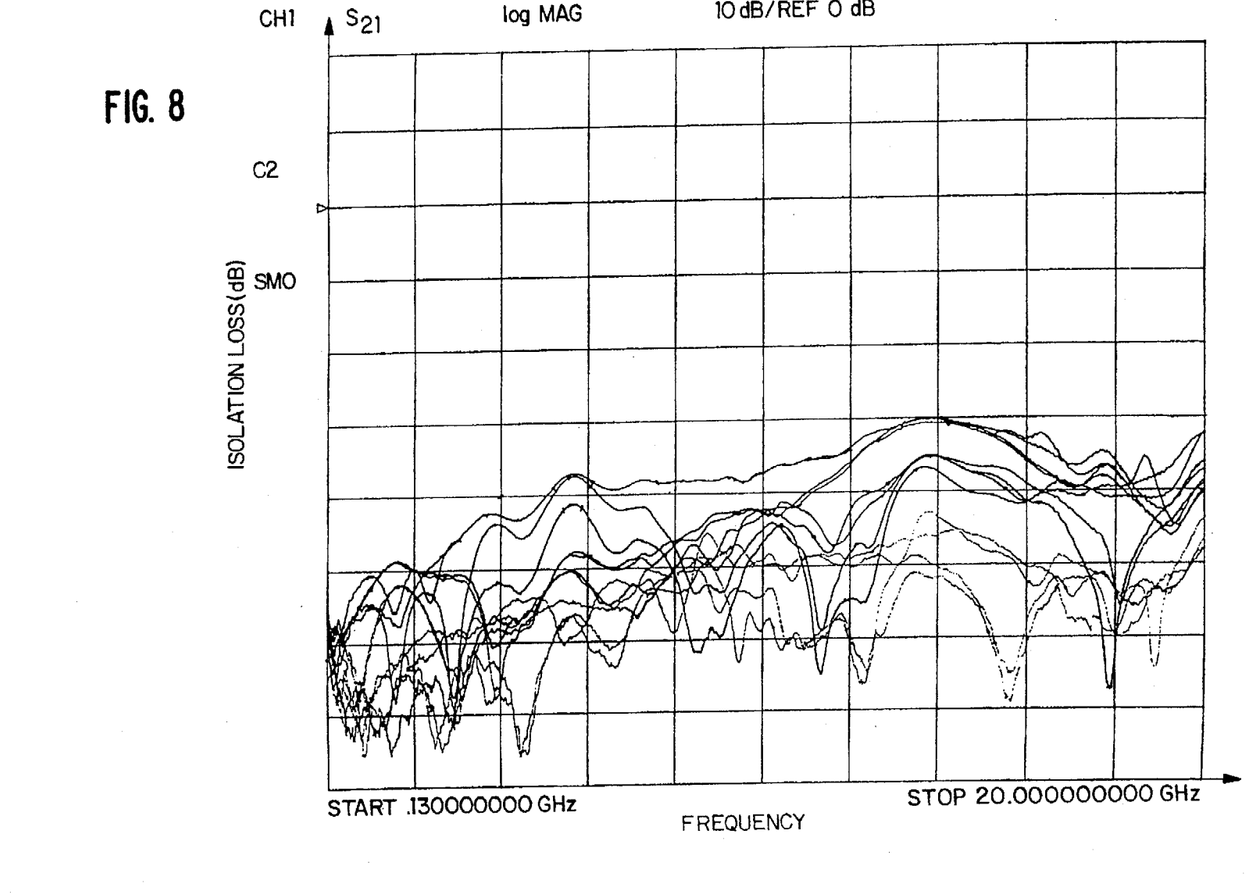
Figure 9:
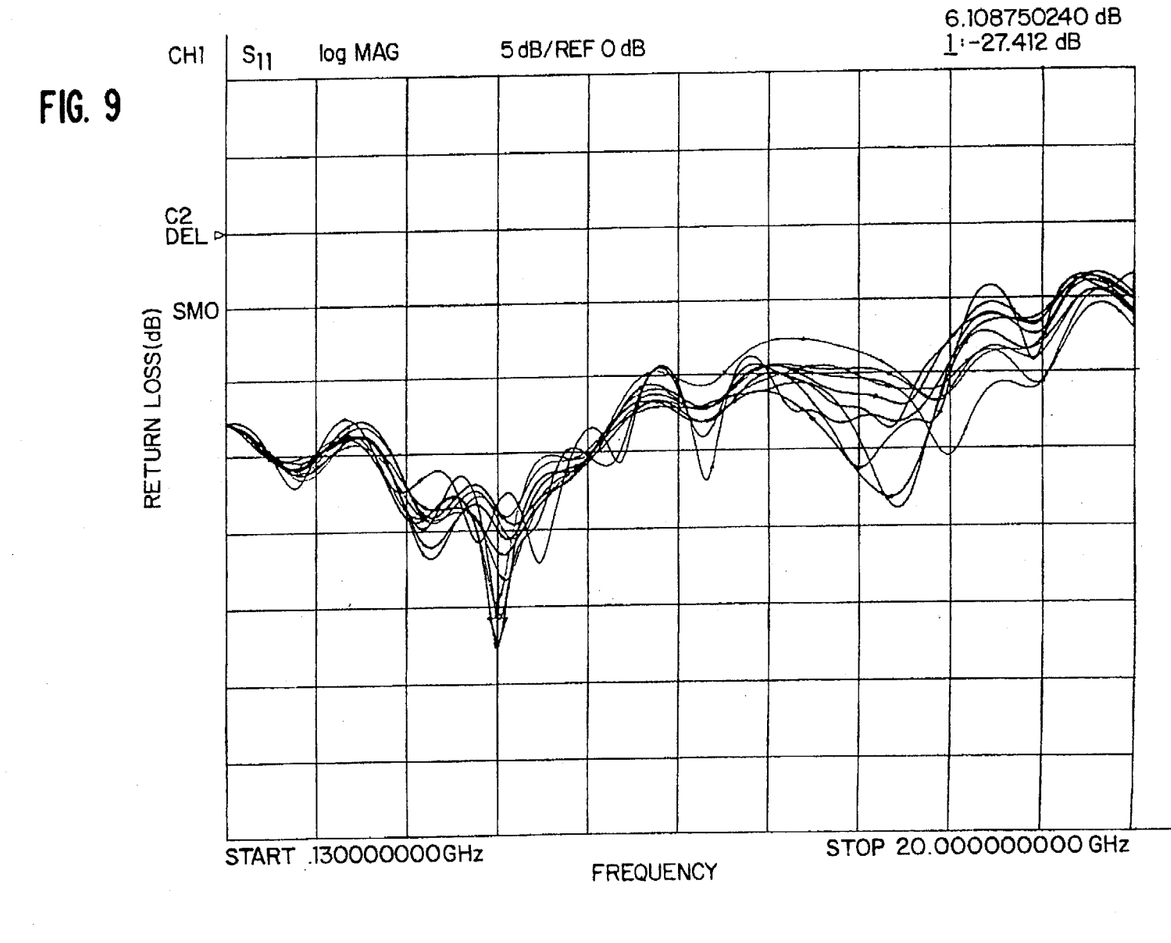

A MMIC mask layout of the transfer switch with dimensions of 1.85 mm by 2.35 mm is shown in FIG. 6. The measurements of the insertion loss, isolation, and return loss of all three states are presented in FIGS. 7, 8, and 9, respectively. As seen by inspection of FIGS. 7 to 9, circuitry constructed according to the preferred embodiments of the present invention advantageously maintain good performance across a fairly broad band, with insertion loss less than 5 dB, isolation higher than 35 dB and return loss better than 10 dB, up to 12 GHz.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A solid-state electronic switching module operating in at least two connection states, said switching module comprising:

a plurality of access nodes;

a plurality of passive solid-state switching elements; and a plurality of bias connections permitting application of biasing signals to respective passive solid-state switching elements;

wherein, during a first connection state, a first connecting path, connecting first and second access nodes, is defined by a plurality of first passive solid-state switching elements, each responsive to a respective bias signal;

a second connecting path, connecting third and fourth access nodes, is defined by a plurality of second passive solid-state switching elements, each responsive to a respective bias signal;

a first plurality of isolating solid-state switching elements comprises a plurality of third passive solid-state switching elements, each responsive to a respective bias signal and operatively isolating said first and said fourth access nodes;

a second plurality of isolating solid-state switching elements comprises a plurality of fourth passive solid-state switching elements, each responsive to a respective bias signal and operatively isolating said second and said third access nodes;

and wherein, during a second connection state, a third connecting path, connecting said first and said fourth access nodes, is defined by a plurality of fifth passive solid-state switching elements, each responsive to a respective bias signal;

a fourth connecting path, connecting said second and said third access nodes, is defined by a plurality of sixth passive solid-state switching elements, each responsive to a respective bias signal;

a third plurality of isolating solid-state switching elements comprises a plurality of seventh passive solid-state switching elements, each responsive to a respective bias signal and operatively isolating said first and said second access nodes; and a fourth plurality of isolating solid-state switching elements comprises a plurality of eighth passive solid-state switching elements, each responsive to a respective bias signal and operatively isolating said third and said fourth access nodes.

2. The solid-state electronic switching module as defined in claim 1, wherein each of said connecting and said isolating paths is conductive at a first logic level and nonconductive at a second logic level.

3. The solid-state electronic switching module as defined in claim 2, wherein, with respect to operation in said first connection state, a first logic level bias signal is applied to respective passive solid-state switching elements of said first, second, seventh, and eighth passive solid-state switching elements, while a second logic level bias signal is applied to respective passive solid-state switching elements of said third, fourth, fifth, and sixth passive solid-state switching elements.

4. The solid-state electronic switching module defined in claim 3, wherein said passive solid-state switching elements each comprise a field-effect transistor operating in passive mode.

5. The solid-state electronic switching module as defined in claim 2, wherein, with respect to operation in said second connection state, a first logic level bias signal is applied to respective passive solid-state switching elements of said third, fourth, fifth, and sixth solid-state switching element, while a second logic level bias signal is applied to respective passive solid-state switching elements of said first, second, seventh and eighth solid-state switching elements.

6. The solid-state electronic switching module defined in claim 5, wherein said passive solid-state switching elements each comprise a field-effect transistor operating in passive mode.

7. The solid-state electronic switching module defined in claim 2, wherein said passive solid-state switching elements each comprise a field-effect transistor operating in passive mode.

8. The solid-state electronic switching module defined in claim 1, wherein said passive solid-state switching elements each comprise a field-effect transistor operating in passive mode.

9. The solid-state electronic switching module defined in claim 8, wherein said field-effect transistor is a gallium arsenide field-effect transistor.

10. The solid-state electronic switching module operating in at least three connection states, said switching module comprising:

a plurality of access nodes;

a plurality of passive solid-state switching elements; and a plurality of bias connections permitting application of biasing signals to respective passive solid-state switching elements;

wherein, during a first connection state, a first connecting path, connecting first and second access nodes, is defined by a plurality of first passive solid-state switching elements, each responsive to a respective bias signal;

a second connecting path, connecting third and fourth access nodes, is defined by a plurality of second passive solid-state switching elements, each responsive to a respective bias signal;

a first plurality of isolating solid-state switching elements comprises a plurality of third passive solid-state switching elements, each responsive to a respective bias signal and operatively isolating said first and said fourth access nodes;

a second plurality of isolating solid-state switching elements comprises a plurality of fourth passive solid-state switching elements, each responsive to a respective bias signal and operatively isolating said first and said third access nodes;

a third plurality of isolating solid-state switching elements comprises a plurality of fifth passive solid-state switching elements, each responsive to a respective bias signal and operatively isolating said second and third access nodes;

a fourth plurality of isolating solid-state switching elements comprises a plurality of sixth passive solid-state switching elements, each responsive to a respective bias signal and operatively isolating said second and said fourth access nodes;

wherein, during a second connection state, a third connecting path, connecting said first and said fourth access nodes, is defined by a plurality of seventh passive solid-state switching elements, each responsive to a respective bias signal;

a fourth connecting path, connecting said second and said third access nodes, is defined by a plurality of eighth passive solid-state switching elements, each responsive to a respective bias signal;

a fifth plurality of isolating solid-state switching elements comprises a plurality of ninth passive solid-state switching elements, each responsive to a respective bias signal and operatively isolating said first and said second access nodes;

a sixth plurality of isolating solid-state switching elements comprises a plurality of tenth passive solid-state switching elements, each responsive to a respective bias signal and operatively isolating said first and said third access nodes;

a seventh plurality of isolating solid-state switching elements comprises a plurality of eleventh passive solid-state switching elements, each responsive to a respective bias signal and operatively isolating said third and said fourth access nodes;

an eighth plurality of isolating solid-state switching elements comprises a plurality of twelfth passive solid-state switching elements, each responsive to a respective bias signal and operatively isolating said second and said fourth access nodes;

and wherein, during a third connection state, a fifth connecting path, connecting said first and said third access nodes, is defined by a plurality of thirteenth passive solid-state switching elements, each responsive to a respective bias signal;

a sixth connecting path, connecting said second and said fourth access nodes, is defined by a plurality of fourteenth passive solid-state switching elements, each responsive to a respective bias signal;

a ninth plurality of isolating solid-state switching elements comprises a plurality of fifteenth passive solid-state switching elements, each responsive to a respective bias signal and operatively isolating said first and said fourth access nodes;

a tenth plurality of isolating solid-state switching elements comprises a plurality of sixteenth passive solid-state switching elements, each responsive to a respective bias signal and operatively isolating said first and said second access nodes;

an eleventh plurality of isolating solid-state switching elements comprises a plurality of seventeenth passive solid-state switching elements, each responsive to a respective bias signal and operatively isolating said second and said third access nodes;

a twelfth plurality of isolating solid-state switching elements comprises a plurality of eighteenth passive solid-state switching elements, each responsive to a respective bias signal and operatively isolating said third and said fourth access nodes.

11. A solid-state electronic switching module operating in at least three connection states as defined in claim 10, wherein each of said connecting paths is conductive, at a first logic level and non-conductive at a second logic level.

12. The solid-state electronic switching module operating in at least three connection states as defined in claim 11, wherein, with respect to said first connection state, a first logic level bias signal is applied to respective passive solid-state switching elements of said first and said second passive solid-state switching elements, and a second logic level bias signal is applied to respective passive solid-state switching elements of said ninth, said eleventh, said sixteenth and said eighteenth passive solid state switching elements.

13. The solid-state electronic switching module defined in claim 12, wherein said passive solid-state switching elements each comprise a field-effect transistor operating in passive mode.

14. The solid-state electronic switching module as defined in claim 11, wherein, with respect to said second connection state, a first logic level bias signal is applied to respective passive solid-state switching elements of said seventh and eighth passive solid-state switching elements, and a second logic level bias signal is applied to respective passive solid-state switching elements of said third, said fifth, said fifteenth and said seventeenth passive solid-state switching elements.

15. The solid-state electronic switching module defined in claim 14, wherein said passive solid-state switching elements each comprise a field-effect transistor operating in passive mode.

16. The solid state electronic switching module as defined in claim 11, wherein, with respect to said third connection state, a first logic level bias signal is applied to respective passive solid-state switching elements of said thirteenth and said fourteenth passive solid state switching elements, and a second logic level bias signal is applied to respective passive solid state switching elements of said fourth, said sixth, tenth and said twelfth passive solid state switching elements.

17. The solid-state electronic switching module defined in claim 16, wherein said passive solid-state switching elements each comprise a field-effect transistor operating in passive mode.

18. The solid-state electronic switching module defined in claim 11, wherein said passive solid-state switching elements each comprise a field-effect transistor operating in passive mode.

19. The solid-state electronic switching module defined in claim 10, wherein said passive solid-state switching elements each comprise a field-effect transistor operating in passive mode.

20. The solid-state electronic switching module defined in claim 19, wherein said field-effect transistor is a gallium arsenide field-effect transistor.

* * * * *